United States Patent
Murakami et al.

[11] Patent Number: 5,952,703
[45] Date of Patent: *Sep. 14, 1999

[54] SEMICONDUCTOR DEVICES AND MANUFACTURING METHOD USING II-VI COMPOUNDS WITH WIDE AREA

[75] Inventors: Satoshi Murakami; Tetsuo Saito; Hironori Nishino; Yoichiro Sakachi; Tohru Okamoto; Kenji Maruyama, all of Kawasaki, Japan

[73] Assignee: Fujitsu Limited, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/576,091

[22] Filed: Dec. 21, 1995

[30] Foreign Application Priority Data

Mar. 15, 1995 [JP] Japan ................................. 7-056233

[51] Int. Cl.[6] .................. H01L 31/00; H01L 31/072; H01L 31/109; H01L 29/22
[52] U.S. Cl. ................... 257/442; 257/188; 257/190; 257/614; 257/627
[58] Field of Search ................... 257/188, 442, 257/22, 190, 614, 627, 628

[56] References Cited

U.S. PATENT DOCUMENTS

| | | | |
|---|---|---|---|
| 4,566,918 | 1/1986 | Irvine et al. | 257/188 |
| 4,872,046 | 10/1989 | Morkoc et al. | 257/628 |
| 4,897,152 | 1/1990 | Chen . | |
| 4,910,154 | 3/1990 | Zanio et al. | 257/188 |
| 4,915,744 | 4/1990 | Ho et al. | 136/262 |
| 4,999,694 | 3/1991 | Austin et al. | 257/188 |
| 5,192,695 | 3/1993 | Wang et al. | 437/5 |
| 5,508,522 | 4/1996 | Nakanishi et al. | 257/13 |

FOREIGN PATENT DOCUMENTS

| | | | |
|---|---|---|---|
| 2612335 | 9/1988 | France | 257/188 |
| 3-196683 | 8/1991 | Japan . | |

OTHER PUBLICATIONS

E. Ligeon et al., Structure of (111) CdTe epilayers on misoriented (001) GaAs, J. Appln. Phys. 67(5), Mar. 1990, pp. 2428–2433.

I. Hähnert et al., New Defect Etchants for CdTe and $Hg_{1-x}Cd_xTe$, Journal of Crystal Growth 101 (1990), pp. 251–255.

R. Korenstein et al., Growth of (111) CdTe on GaAs/Si and Si substrates for HgCdTe epitaxy, J. Vac. Sci, Technol. B 10(4), Jul./Aug. 1992, pp. 1370–1375.

Masahiro Akiyama et al.; "Growth of high quality GaAs layers on Si substrates by MOCVD", Journal of Crystal Growth 77 (1986) pp. 490–497.

J. Electronic Materials (1993) 22, 847.

*Primary Examiner*—Mahshid Saadat
*Assistant Examiner*—Allan R. Wilson
*Attorney, Agent, or Firm*—Armstrong, Westerman Hattori, McLeland & Naughton

[57] ABSTRACT

A semiconductor device having: a support substrate having an upper surface; a HgTe layer formed on the support substrate; and a HgCdTe layer directly formed on the HgTe layer. A semiconductor device of another type having: a support substrate having an exposed upper surface tilted from the (100) plane of a single crystal with a diamond structure by a certain angle, along a direction offset by an angle larger than 0° and smaller than 45° from the [011] direction in the (100) plane; a group III–V compound semiconductor layer formed on the support substrate; and a group II–VI compound semiconductor layer formed on the group III–V compound semiconductor layer.

14 Claims, 10 Drawing Sheets

SEMICONDUCTOR DEVICES AND MANUFACTURING METHOD USING II-VI COMPOUNDS WITH WIDE AREA

BACKGROUND OF THE INVENTION a) Field of the Invention

The present invention relates to a crystal growth technique for epitaxially growing a group II–VI compound semiconductor layer. The crystal growth technique of this invention is particularly suitable for growing crystals of, for example, mercury-cadmium telluride (HgCdTe) which is used for infrared detectors.

b) Description of the Related Art

Conventionally, HgCdTe has been grown on a bulk substrate such as CdTe and CdZnTe. It is necessary for an improvement on a resolution of an infrared detector to use a large area HgCdTe layer and form a number of pixels. However, it is difficult to form a large area bulk substrate such as CdTe and CdZnTe. In order to meet the requirements of a large area bulk substrate, it is necessary to grow a HgCdTe layer on a substrate having a lattice constant greatly different from HgCdTe, such as a GaAs substrate, an Si substrate, and a GaAs layer on an Si substrate.

In growing a HgCdTe layer on a substrate having a greatly different lattice constant, a CdTe buffer layer is used on which the HgCdTe layer is formed. However, a lattice mismatch between HgCdTe and the substrate such as GaAs is larger than a lattice mismatch between HgCdTe and a bulk substrate such as CdTe. Therefore, the HgCdTe layer grown on a different type substrate has a high dislocation density. Semiconductor devices made of crystals having a high dislocation density have generally poor electric and/or optical characteristics.

Japanese Patent Laid-open Publication No. Hei 3-196683 has proposed to forcibly curve, deflect or turn penetrating dislocation and suppress the propagation of dislocation by inserting a superlattice structure of HgTe/CdTe between a substrate and an HgCdTe layer. However, it is reported that because alternately growing two layers of HgTe and CdTe under the same condition is difficult, crystallinity becomes worse rather than directly growing a HgCdTe layer on a substrate, and the dislocation density becomes high (D. D. Edwall, J. Electronic Materials, 22, 847 (1933)).

Indium (In) bumps are generally used for the interconnection of an infrared detector of an array type formed on a HgCdTe layer to a signal processing circuit formed on an Si substrate. Since HgCdTe and Si have different thermal expansion coefficients, the infrared detector becomes likely to be peeled off from the Si substrate if the chip size is large.

As above, it is difficult for conventional techniques to grow a HgCdTe layer of a large area.

SUMMARY OF THE INVENTION

It is an object of the present invention to provide a crystal growth technique for growing a HgCdTe layer of a large area with less dislocation.

It is another object of the present invention to provide a crystal growth technique for growing a single crystal layer of group II–VI compound semiconductor on a substrate having a diamond structure.

According to one aspect of the present invention, there is provided a semiconductor device comprising: a support substrate having an upper surface; a HgTe layer formed on the support substrate; and a HgCdTe layer directly formed on the HgTe layer.

If the HgTe layer is formed on the surface of the support substrate prior to growing the HgCdTe Layer on the support substrate, the dislocation density of the HgCdTe layer lowers.

The thickness of the HgTe layer may be set to 0.3 $\mu$m or thinner.

The thickness of the HgTe layer of 0.3 $\mu$m or thinner is sufficient. With this thickness, an infrared ray is transmissive through the HgTe layer. If the HgCdTe layer is used for an infrared detector, an infrared ray can be made incident from the bottom of the substrate via the transmissive HgTe layer.

The HgCdTe layer may be formed in each mesa structure disposed in an array. With this structure, cracks or the like can be prevented from being generated by a difference of thermal expansion coefficients between the support substrate and HgCdTe layer.

According to another aspect of the present invention, there is provided an infrared detector comprising: a support substrate having an upper surface, an infrared ray being transmissive through the support substrate; a HgTe layer formed on the support substrate; a first HgCdTe layer of a first conductivity type directly formed on the HgTe layer; and a second HgCdTe layer of a second conductivity type opposite to the first conductivity type formed on the first HgCdTe layer.

According to still another aspect of the present invention, there is provided a method of manufacturing a semiconductor device comprising the steps of: preparing a support substrate having an exposed surface of a material selected from the group consisting of CdTe, ZnTe, and CdZnTe; epitaxially growing a HgTe layer on the support substrate by chemical vapor deposition using organic metal as a source material; and epitaxially growing a HgCdTe layer on the HgTe layer by chemical vapor deposition using organic metal as a source material.

By applying a HgCdTe layer having a small dislocation density to an infrared detector, the characteristics of the detector can be improved.

The step of growing the HgTe layer and the step of growing the HgCdTe layer are preferably performed at a substrate temperature of 320 to 350° C.

If the HgTe layer is grown at a substrate temperature of 320° to 350° a single crystal HgTe layer can be formed. If a HgCdTe layer is grown on this HgTe layer, a HgCdTe layer of better crystallinity can be formed.

According to a further aspect of the present invention, there is provided a semiconductor device comprising: a support substrate having an exposed upper surface tilted from the (100) plane of a single crystal with a diamond structure by a certain angle, along a direction offset by an angle larger than 0° and smaller than 45° from the [011] direction in the (100) plane; a group III–V compound semiconductor layer formed on the support substrate; and a group II–VI compound semiconductor layer formed on the group III–V compound semiconductor layer.

According to a still further aspect of the present invention, there is provided a method of manufacturing a semiconductor device comprising the steps of: preparing a support substrate having an exposed upper surface tilted from the (100) plane of a single crystal with a diamond structure by a certain angle, along a direction offset by an angle larger than 0° and smaller than 45° from the [011] direction in the (100) plane; epitaxially growing a group III–V compound semiconductor layer on the support substrate, under the condition that group V element steps are grown along steps having the maximum number on the upper surface of the support substrate; and epitaxially growing a group II–VI compound semiconductor layer on the group III–V compound semiconductor layer.

If the exposed upper surface of the support substrate is tilted from the (100) plane of a single crystal with a diamond structure by a certain angle, along a direction offset by an angle larger than 0° and smaller than 45' from the [011] direction in the (100) plane, steps and kinks are formed. All these kinks are pointed to the same direction. If a group III–V compound semiconductor layer is formed on the support substrate under the condition that group V elements are preferentially formed, it is considered that group V element steps and group III element kinks appear on the surface of the group III–V compound semiconductor layer. If a group II–VI compound semiconductor layer is formed on the group III–V compound semiconductor layer, a good single crystal layer with no twin crystal can be formed.

The step of growing the group III–V compound semiconductor layer may include the steps of: subjecting the support substrate to a heat treatment in a source gas atmosphere containing group V elements; and depositing the group III–V compound semiconductor layer by supplying a source gas containing group III elements and a source gas containing group V elements to the support substrate.

According to another aspect of the present invention, there is provided a method of manufacturing a semiconductor device comprising the steps of: preparing a support substrate having an exposed upper surface tilted from the (100) plane of a single crystal with a diamond structure by a certain angle, along the [011] direction; epitaxially growing a group III–V compound semiconductor layer on the support substrate, under the condition that group III element steps are grown along steps having the maximum number on the upper surface of the support substrate; and epitaxially growing a group II–VI compound semiconductor layer on the group III–V compound semiconductor layer.

If the exposed upper surface of the support substrate is tilted from the (100) plane of a single crystal with a diamond structure by a certain angle, along the [011] direction, steps pointing to one direction are formed. If a group III–V compound semiconductor layer is epitaxially grown on the support substrate, under the condition that group III element steps are grown along steps having the maximum number on the upper surface of the support substrate, group III element steps appear on the surface of the group III–V compound semiconductor layer. If a group II–VI compound semiconductor layer is epitaxially formed on the group III–V compound semiconductor layer, a single crystal layer with no twin crystal can be formed.

As described above, it is possible to form a group II–VI compound semiconductor layer having a large area and a low dislocation density, with ease.

DETAILED DESCRIPTION OF THE PREFERRED EMBODIMENTS

A method of growing a HgCdTe layer according to the first embodiment of the invention will be described with reference to FIGS. 1 to 3.

Figure 1:
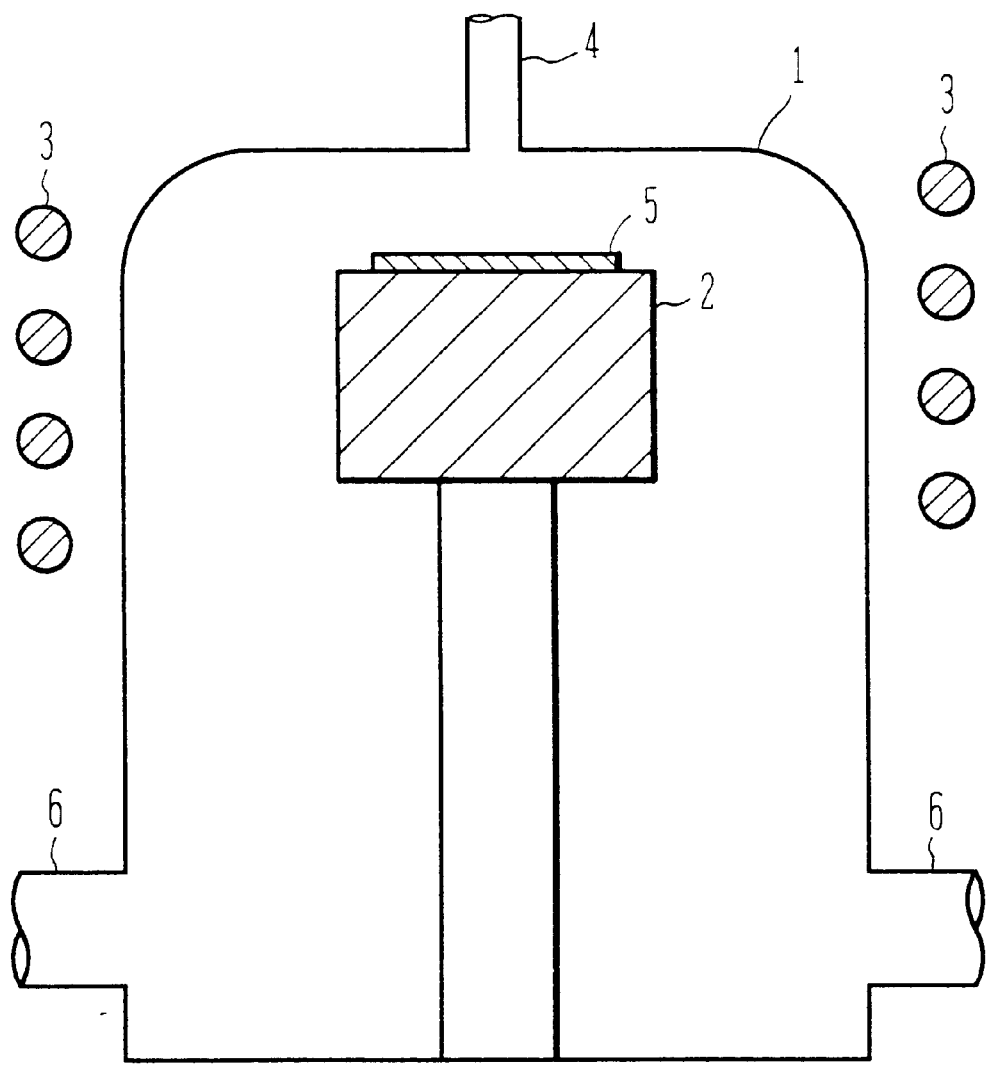
FIG. 1 is a cross sectional view of an MOCVD system used for embodiments of this invention.

FIG. 1 is a schematic cross sectional view of a metal organic chemical vapor deposition (MOCVD) system used for the first embodiment. This crystal growth system includes a crystal growth chamber 1 made of quartz, a substrate susceptor 2 made of carbon, and a radio frequency (RF) coil 3.

A source gas supply port 4 for supplying source gas is formed at the upper portion of the crystal growth chamber 1, and gas exhaust ports 6 for evacuating the inside of the crystal growth chamber 1 are formed at the lower portion. The substrate susceptor 2 is disposed facing its upper surface toward the source gas supply port 4. A support substrate 5 is placed on the upper surface of the substrate susceptor 2 for growing crystal.

The RF coil 3 is disposed outside of the crystal growth chamber 1, surrounding the substrate susceptor 2. As an RF current is flowed in the RF coil 3, an induction current flows in the substrate susceptor 2 to heat it and hence the support substrate 5.

Source gas which contains organic metal and is supplied from the source gas supply port 4 is blown on the surface of the support substrate 5. Organic metal is decomposed on the surface of the support substrate 5 and crystal is grown on the substrate surface. By-products are drained out of the exhaust port 6.

Next, a description will be given for a method of growing a HgCdTe layer on a GaAs layer formed on an Si substrate by using the MOCVD system shown in FIG. 1.

In order to relieve a lattice mismatch of about 15% between GaAs and HgCdTe, a CdTe buffer layer is first formed on a GaAs layer. Source gases are dimethyl cadmium (DMCd) and diisopropyl tellurium (DIPTe), and carrier gas is $H_2$. The pressure of the source gases is an atmospheric pressure. The partial pressure of DMCd is about $10^{-5}$ atmospheric pressure, and that of DIPTe is about $10^{-4}$ atmospheric pressure. The flow rate of the source gases is 8 slm, and the substrate temperature is about 410°. Under these conditions, crystal is grown for about 120 minutes to form a CdTe layer of about 5 µm.

Next, on the CdTe buffer layer, a HgTe layer and a HgCdTe layer are continuously grown.

Figure 2:
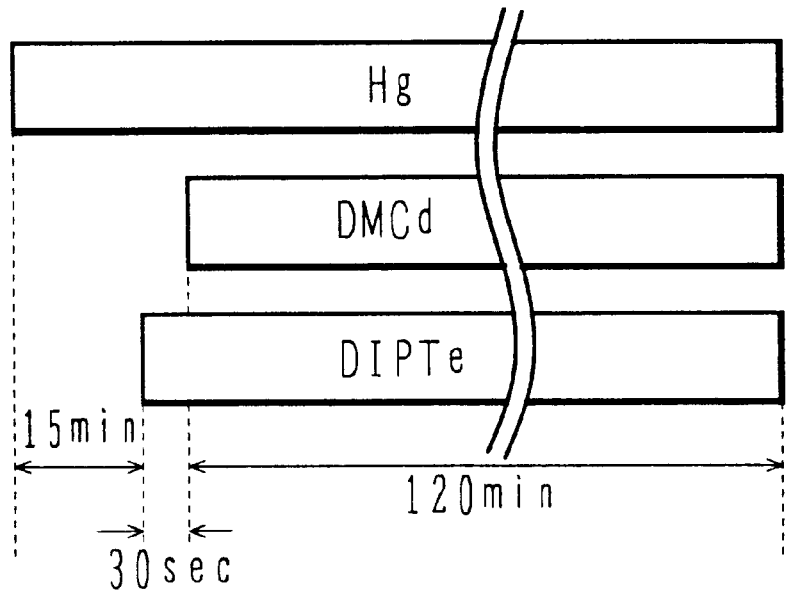
FIG. 2 is a diagram showing a source gas supply flow according to a first embodiment of the invention.

FIG. 2 shows a source gas supply flow. After the support substrate is heated to 360°, Hg gas is supplied for 15 minutes to produce a Hg atmosphere in the crystal growth chamber 1. Next, DIPTe gas as well as Hg gas is introduced for about 30 seconds to deposit a HgTe layer of about 30 nm thick.

Continuously after the HgTe layer is deposited, Hg gas, DIPTe gas, and DMCd gas are introduced for about 120 minutes. The flow rate of the source gases is 5 slm. A HgCdTe layer of about 7 $\mu$m is therefore deposited. A supply of DMCd is adjusted so as to set the Cd composition of HgCdTe to 0.22.

In the above processes, the partial pressure of Hg is $10^{-2}$ atmospheric pressure, that of DMCd is $10^{-5}$ atmospheric pressure, and that of DIPTe is $10^{-3}$ atmospheric pressure. The partial pressure of Hg is set to $10^{-2}$ so that it becomes higher than a dissociation pressure of HgTe at a growth temperature.

Figure 3:
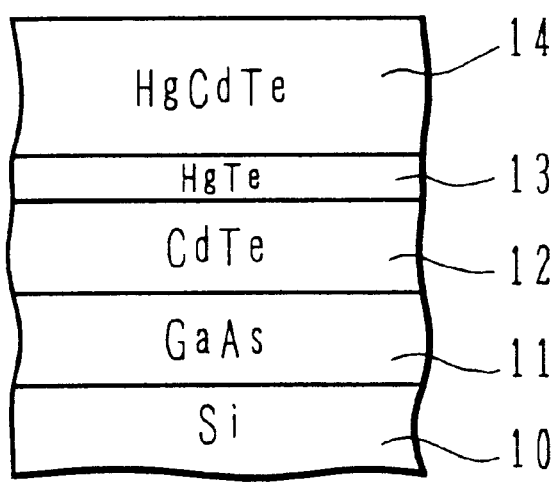
FIG. 3 is a cross sectional view showing a laminate structure of a semiconductor device according to the first embodiment of the invention.

FIG. 3 shows a laminate structure of the substrate formed by the above processes. An Si substrate 10 has a GaAs layer 11 formed thereon. The GaAs layer 11 has a CdTe layer 12 of 5 $\mu$m thick, a HgTe layer 12 of 30 nm thick, and a HgCdTe layer 14 of 7 $\mu$m thick, respectively and continuously formed on the GaAs layer 11 in this order. The lattice constants are related to each other by Si<GaAs<HgTe<HgCdTe<CdTe.

Next, the evaluation results of crystallinity of the laminate structure shown in FIG. 3 will be described with reference to FIGS. 4 to 6.

Figure 4:
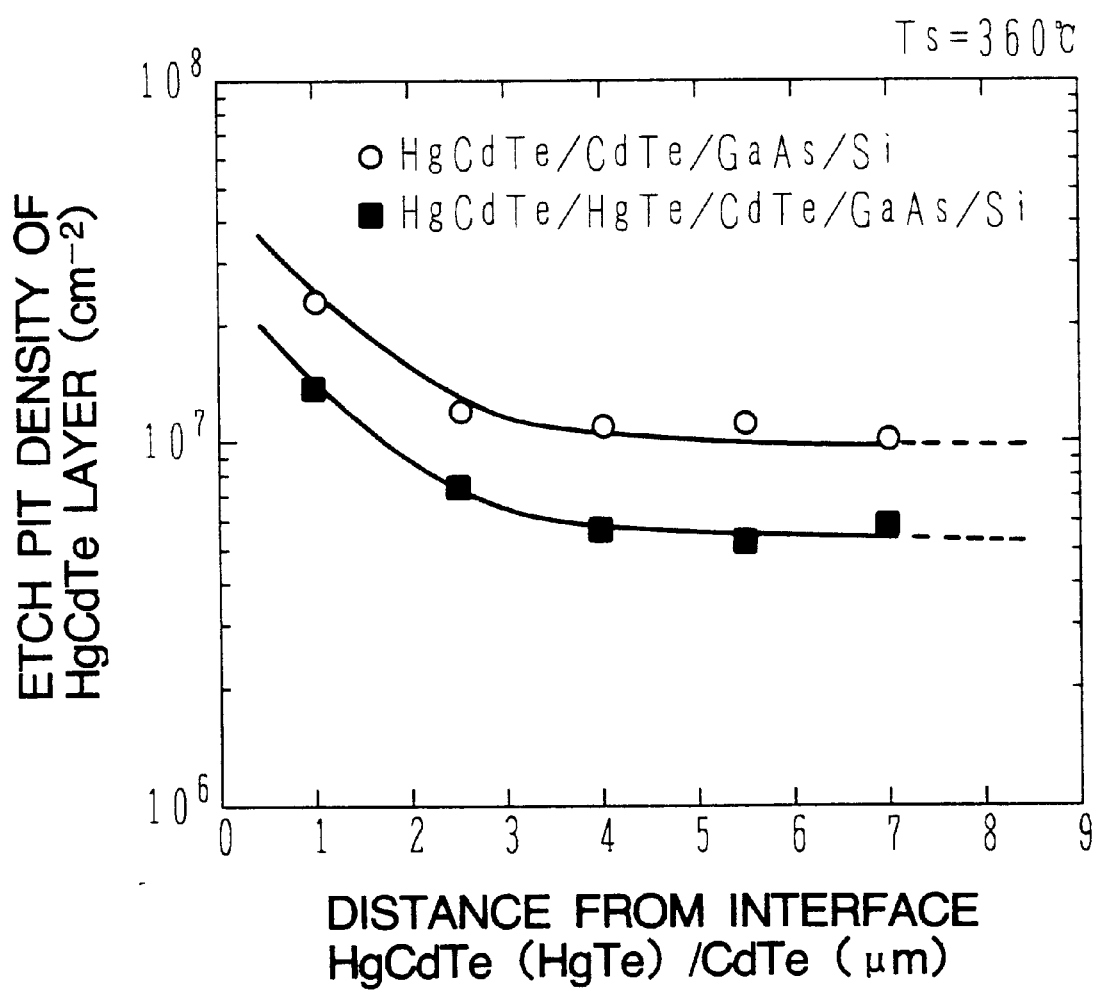
FIG. 4 is a graph showing an etch pit density of the HgCdTe layer of the laminate structure shown in FIG. 3.

FIG. 4 is a graph showing the etch pit density of the HgCdTe layer formed under the above conditions, in comparison with a HgCdTe layer directly formed on a CdTe layer. The abscissa represents a distance in the unit of $\mu$m in the thickness direction of the HgCdTe layer from an interface between the HgCdTe layer and CdTe layer or from an interface between the HgTe layer and CdTe layer. The ordinate represents an etch pit density in the unit of cm$^{-2}$. Since the thickness of the HgTe layer is 0.03 $\mu$m, the position on the abscissa hardly changes even if the thickness of the HgTe layer is neglected. A solid square symbol represents an etch pit density of the HgCdTe layer formed under the above conditions, and a circle symbol represents an etch pit density of the HgCdTe layer directly formed on the CdTe layer. It is considered that the etch pit density corresponds to a dislocation density in crystal. As an etchant of HgCdTe, a mixed solution of HF, CrO$_3$, and HCl diluted by water was used. This etchant is reported by I. Hahnert and M. Schenk, in "Journal of Crystal Growth" 101 (1990) 251. Etchant reported by J. S. Chen (U.S. Pat. No. 4,897,152) may be used.

In both the cases where the HgTe layer is inserted or not inserted between the CdTe layer and HgCdTe layer, the etch pit density is large near at the interface to the CdTe layer, and it lowers at the position away from the interface. The etch pit density is generally constant at the position away from the interface by about 5 $\mu$m or more.

With the HgTe layer inserted between the CdTe layer and HgCdTe layer, the etch pit density is about $1.5 \times 10^7$ cm$^{-2}$ at the position away from the interface of the CdTe layer by 1 $\mu$m, and about $6 \times 10^6$ cm$^{-2}$ at the position away from the interface by about 5 $\mu$m. With the HgCdTe layer formed directly on the CdTe layer, the etch pit density is about $2.5 \times 10^7$ cm$^{-2}$ at the position away from the interface of the CdTe layer by 1 $\mu$m, and about $1 \times 10^7$ cm$^{-2}$ at the position away from the interface by about 5 $\mu$m.

It is seen from FIG. 4 that the inserted HgTe layer lowers the dislocation density of the HgCdTe layer.

Figure 5:
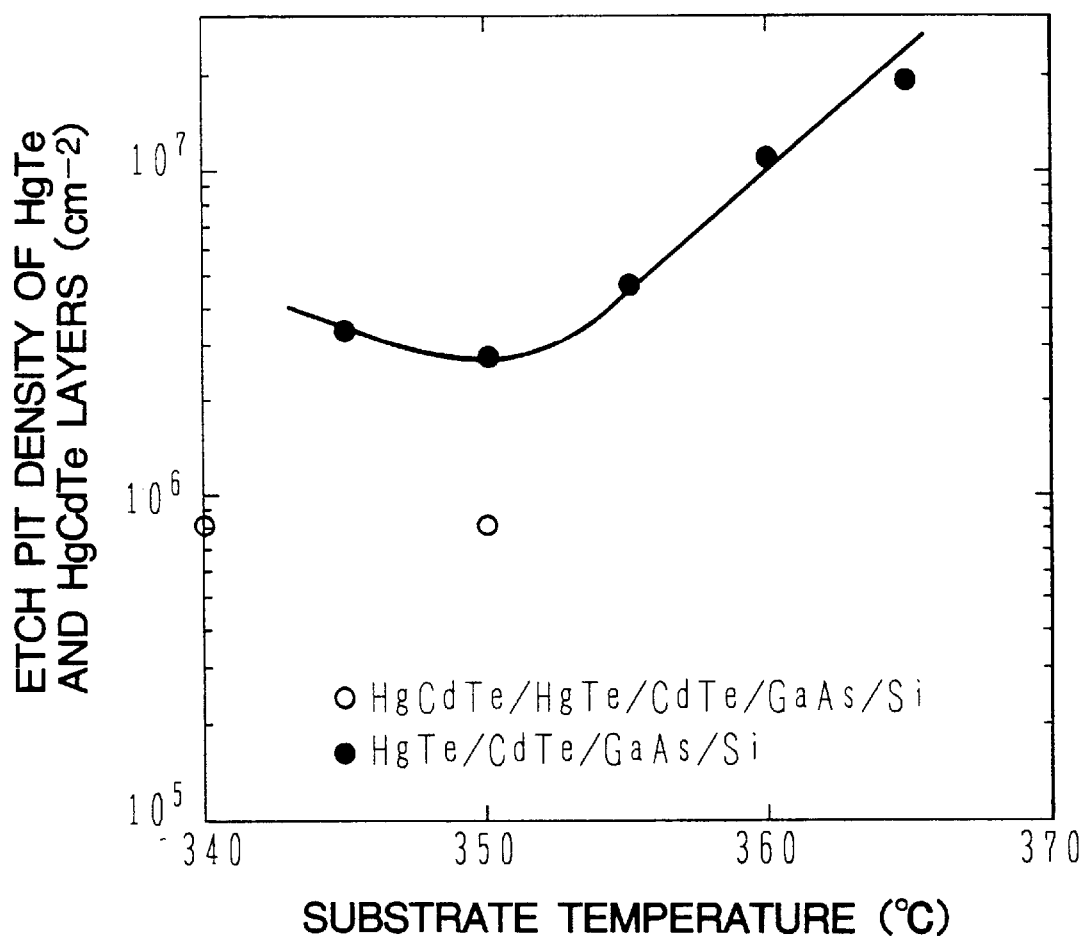
FIG. 5 is a graph showing an etch pit density of the HgTe layer and HgCdTe layer of the laminate structure shown in FIG. 3.

FIG. 5 shows the growth temperature dependency of the etch pit density of the crystal surface. The abscissa represents a substrate temperature in the unit of ° C. when the HgTe layer and HgCdTe are grown. The ordinate represents an etch pit density of the crystal surface in the unit of cm$^{-2}$. A circle symbol represents an etch pit density of the HgTe layer surface when only the HgTe layer is grown on the surface of CdTe to a thickness of several $\mu$m, and a solid circle symbol represents an etch pit density of the HgCdTe layer surface grown under the conditions described with FIG. 2.

It has been found from the observation of etch pits that although the HgTe layer grown at a substrate temperature of 360° C. is polycrystalline, the HgTe layer grown at a substrate temperature of 340 to 350° C. is a single crystal. This may be considered that dissociation of HgTe is suppressed at a lower substrate temperature. At the substrate temperatures of 340 and 350° C., the etch pit density of the HgTe layer surface lowers to about $8 \times 10^5$ cm$^{-2}$.

The etch pit density of the HgCdTe layer surface is about $3 \times 10^6$ cm$^{-2}$ at the substrate temperature of 340 to 350° C. As the substrate temperature is raised, the etch pit density increases. It is seen from FIG. 5 that the substrate temperature is preferably set to 340 to 350° C. when the HgTe layer and HgCdTe layer are grown.

At a growth temperature of 340° C. or lower, the growth speed reduces. Generally, as the growth speed lowers, single crystal is likely to be formed. Therefore, a single crystal HgTe layer is possibly grown at a temperature of 340° C. or lower. However, at a temperature of 320° C. or lower, DIPTe as the Te source material becomes hard to be decomposed. Therefore, the temperature is preferably set to 320° C. or higher.

Figure 6:
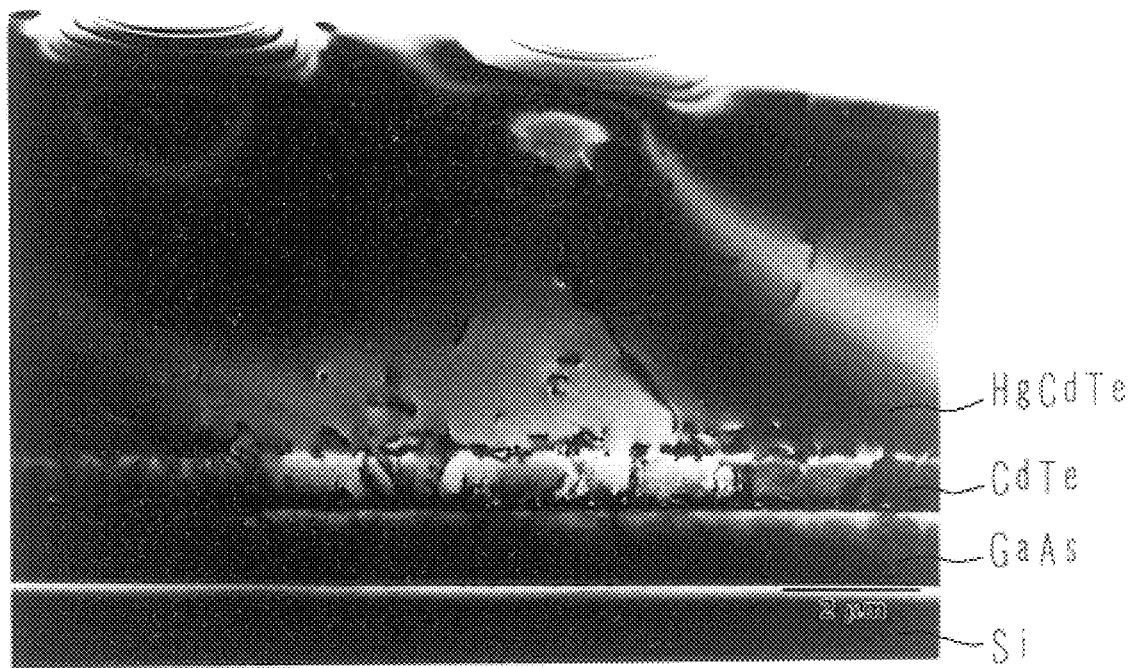
FIG. 6 is a TEM photograph of a crystal structure having the laminate structure shown in FIG. 3.

FIG. 6 is a TEM photograph showing the cross section of a laminate structure having a HgCdTe layer grown at a substrate temperature of 350° C. An Si substrate, a GaAs layer, a CdTe layer, and a HgCdTe layer can be observed in this order from the bottom. Although a HgTe layer is formed between the CdTe layer and HgCdTe layer, it is not clearly shown in the photograph because it is very thin.

It is seen from FIG. 6 that although many dislocations are present in the CdTe layer as compared to other layers, most of the dislocations are shut away at the interface between the CdTe layer and HgCdTe layer and do not enter the inside of the HgCdTe layer. It can be considered therefore that dislocations are shut away by the HgTe layer formed at the interface between the HgCdTe layer and CdTe layer.

It is seen from FIGS. 4 and 6 that the HgTe layer inserted between the HgCdTe layer and CdTe allows the HgCdTe layer with less dislocation to be formed. It is also seen from FIG. 5 that the growth temperature of the HgTe layer and HgCdTe layer is preferably 340 to 350° C.

Since it can be considered that the HgTe layer functions to shut away dislocations which otherwise propagate from the CdTe layer into the HgCdTe layer, the similar effects can be expected regardless of the type of the substrate under the CdTe layer. For example, the HgTe layer is effective also when the HgCdTe layer is formed over the CdTe layer on an Si substrate or a GaAs substrate.

The second embodiment will be described next.

According to the report by Akiyama et al., in "Journal of Crystal Growth", 77 (1986) 490, a single domain GaAs layer can be grown on an Si substrate, by using an off-substrate having a growth surface tilted from the (100) plane in the direction in the (100) plane other than the [001] direction, preferably in the [011] direction, and a single domain GaAs layer cannot be grown on a substrate having a surface of the just (100) plane, or on an off-substrate having the (100) plane tilted in the [010] direction.

It is preferable therefore to grow a CdTe layer on a GaAs layer formed on an Si substrate, by using an off-substrate having the growth surface tilted at least from the (100) plane in the direction in the (100) plane other than [001] direction.

Figure 7:
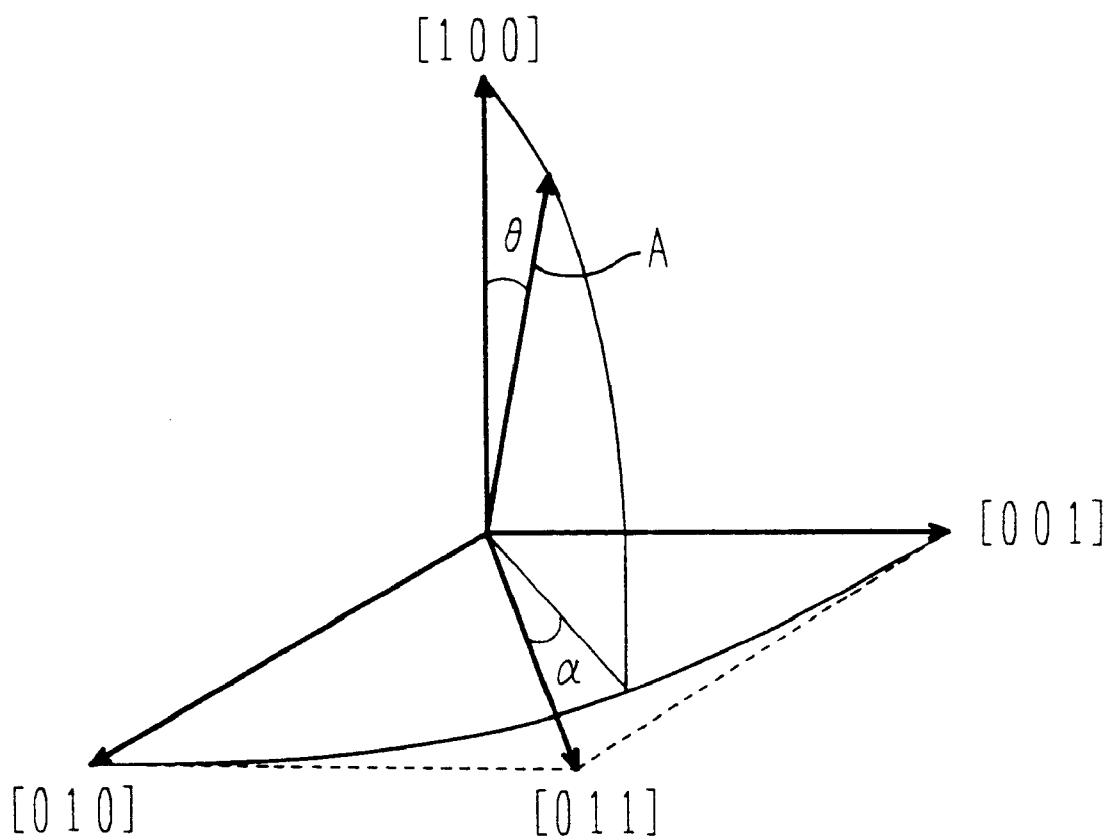
FIG. 7 is a diagram illustrating a tilted (100) plane of crystal.

FIG. 7 illustrates the direction of tilting an Si substrate three-dimensionally. An arrow A in FIG. 7 shows a normal line of the growth surface tilted from the (100) plane by an angle θ along a direction offset by an angle α from the [011] direction in the (100) plane. According to this report by Akiyama et al., the angle α is set in the range of $0 \leq \alpha < 45°$ in order to grow a GaAs of a single domain structure. The angle α is an angle between the [011] direction and the direction along which the growth surface is tilted from the (100) plane. The angle θ is an angle by which the growth surface is titled from the (100) plane.

Crystallinity of HgCdTe layers was evaluated by using (100) Si off-substrates with the angles α=0° and 20° and the angle θ=2° and by growing a GaAs layer, a CdTe layer, and a HgCdTe layer in this order on the Si off-substrate.

Si off-substrates with the angles α=0° and 20° and the angle θ=2° having a thickness of 600 μm are prepared. These off-substrates are pre-baked at a substrate temperature of 800 to 1000° C. in an arsine ($AsH_3$) atmosphere by using the MOCVD system shown in FIG. 1. Pre-baking in an arsine atmosphere is performed in order to suppress re-evaporation of Ga from GaAs attached to the growth chamber and prevent Ga from being attached to the Si substrate.

Next, by using trimethyl gallium (TMGa) and $AsH_3$ as source gases, a GaAs layer is deposited to a thickness of about 1 μm by using the MOCVD system. With these processes, As steps are formed along the direction of steps having the maximum number on the Si off-substrate. A CdTe layer is grown to a thickness of about 4 μm on the GaAs layer by using the MOCVD system and DMCd and DIPTe as source gases. Next, Hg is added to the source gases to deposit a HgCdTe layer to a thickness of about 4 μm.

Figure 8A:
FIGS. 8A and 8B are photographs taking enlarged views of fine patterns formed on the surface of a HgCdTe layer on a substrate of a semiconductor device according to a second embodiment of the invention, the photographs illustrating the directions of etch pits on the HgCdTe layer surface.
Figure 8A:
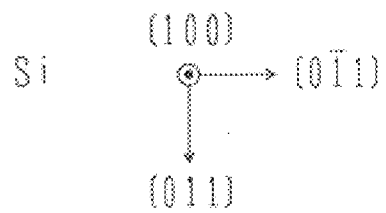
Figure 8A:
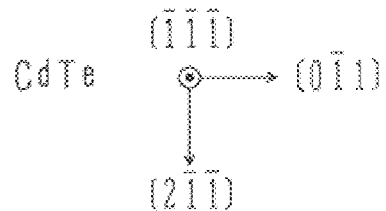
Figure 8B:
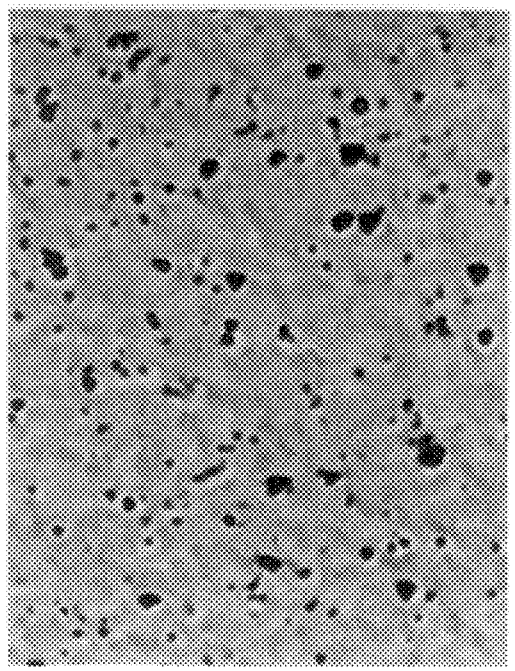
Figure 8B:
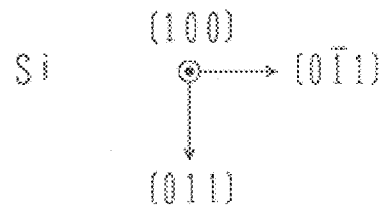
Figure 8B:
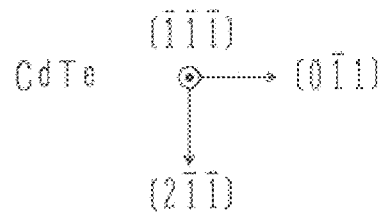

FIGS. 8A and 8B are photographs taking enlarged views of etch pits on the etched surfaces of HgCdTe layers formed by the above processes on the Si off-substrates with the angles α=0° and 20° and the angle θ=2°. In both FIGS. 8A and 8B, the [011] direction of the Si substrates is pointed from the upper portion to the lower portion of the drawings, and the [0$\bar{1}$1] direction is pointed from the left to the right. The [2$\bar{1}\bar{1}$] direction of the CdTe layer is pointed from the upper portion to the lower portion of the drawings, and he [0$\bar{1}$1] direction is pointed from the left to the right. The etchant used is the same as the etchant used for measuring the etch pit density shown in FIG. 4. It is understood from a careful observation of FIG. 8A that etch pits are downward triangles in most regions, and the etch pits in the region surrounded by an ellipsoidal black shadow at the lower right are upward triangles. The etch pits shown in FIG. 8B are downward triangles in all the regions.

Presence of regions having the 180° different directions of triangular etch pits means that there are at least two regions of HgCdTe having the [2$\bar{1}\bar{1}$] directions different by 180°. Namely, it means that twin crystals are formed.

As shown in FIG. 8A, twin crystals are formed in the HgCdTe layer when the Si off-substrate is used having the angle α=0°, i.e., having the growth surface being tilted from the (100) plane in the [011] direction. In contrast, as shown in FIG. 8B, twin crystals are not formed when the Si off-substrate with the angle α=20° is used. The reason why twin crystals are not formed at the angle α=20° may be considered as in the following.

First, forming a CdTe layer on a GaAs substrate will be described with reference to FIGS. 9A and 9B.

Figure 9A:
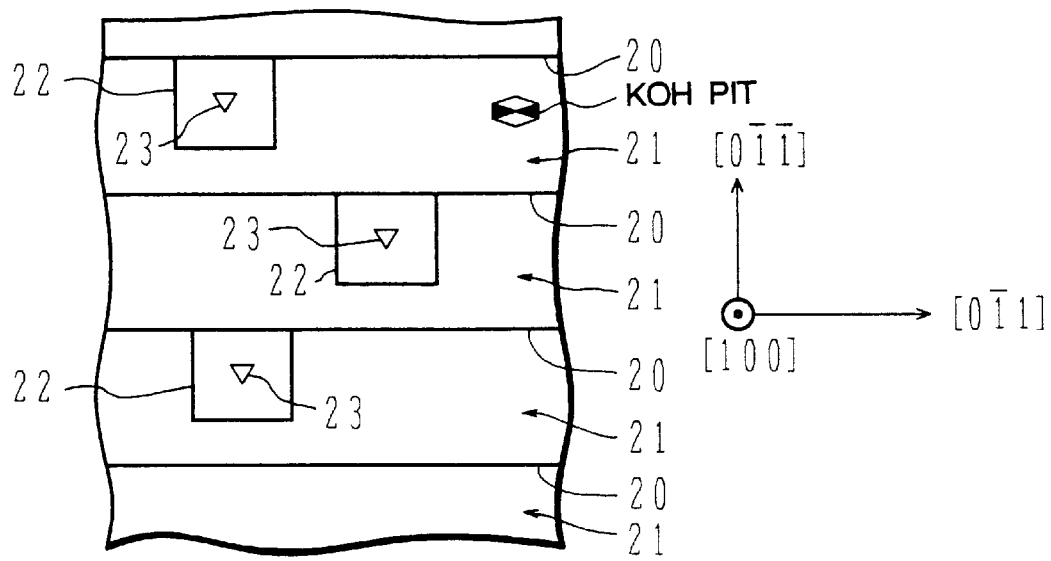
FIGS. 9A and 9B are schematic plan views of substrate surfaces illustrating the growth conditions of a CdTe layer formed on a GaAs surface and the directions of etch pits on respective CdTe regions.

FIG. 9A is a schematic plan view showing a CdTe layer grown on a GaAs surface having Ga steps. The growth surface of GaAs is tilted from the (100) plane in the [011] direction. On the GaAs surface, four Ga steps 20 are formed in the horizontal direction as viewed in FIG. 9A. A terrace 21 is formed between adjacent steps 20. It is assumed that the terrace 21 is high at the upper area as viewed in FIG. 9A and low at the lower area. As a CdTe layer is deposited on the GaAs surface, a CdTe region 22 is grown on the terrace 21 while the Ga step 20 functions as a growth nucleus.

An etch pit 23 in the CdTe region 22 grown from the Ga step 20 is a downward triangle directing away from the Ga step 20 of the growth nucleus. Namely, twin crystals are formed in the CdTe layer grown on the GaAs surface with the Ga step.

Figure 9B:
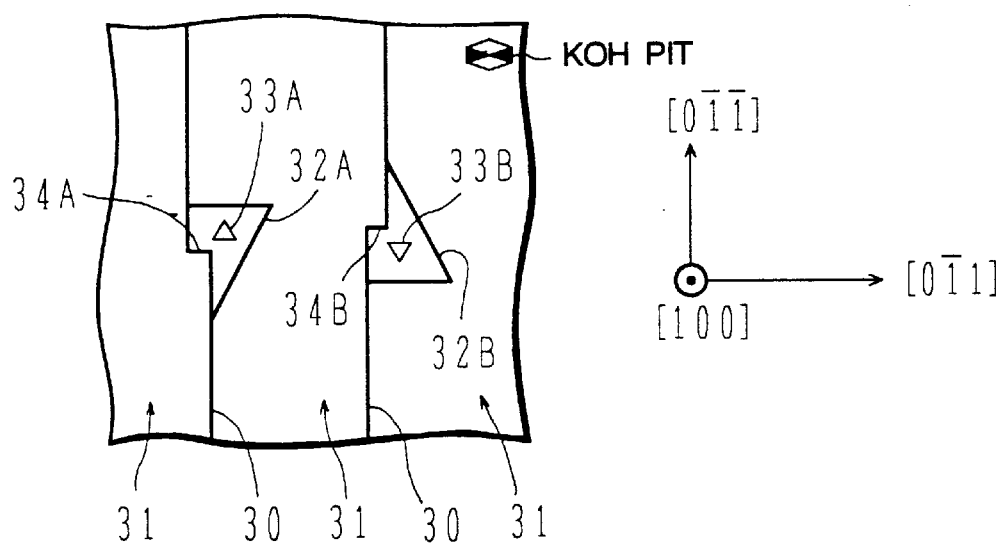

FIG. 9B is a schematic plan view showing a CdTe layer grown on a GaAs surface having As steps. The growth surface of GaAs is tilted from the (100) plane in the [0$\bar{1}$1] direction. On the GaAs surface, two As steps 30 are formed in the vertical direction as viewed in FIG. 9B. A terrace 31 is formed between adjacent steps 30. It is assumed that the terrace 31 is high at the left area as viewed in FIG. 9B and low at the right area. The As step 30 is straight in an ideal case. However, because of a slight shift from the plane surface of the substrate or other reasons, Ga kinks 34A and 34B appear in a real case. The directions of Ga kinks are not always the same, but Ga kinks having directions different by 180° may appear. In FIG. 9B, the Ga kink 34A directs upward as viewed in FIG. 9B, whereas the Ga kink 34B directs downward.

As a CdTe layer is deposited on the GaAs surface, CdTe regions 32A and 32B are grown on the terrace 31 while the Ga kinks 34A and 34B function as growth nuclei. An etch pit in CdTe region grown from the Ga kink is a downward triangle directing the same direction as that of the corresponding Ga kink of the growth nucleus.

For example, as shown in FIG. 9B, the etch pit 33A in the CdTe region 32A grown from the Ga kink 34A is an upward triangle, whereas the etch pit 33B in the CdTe region 32B grown from the Ga kink 34B is a downward triangle. Twin crystals are therefore formed in the CdTe layer grown on the GaAs surface having As steps.

Figure 10A:
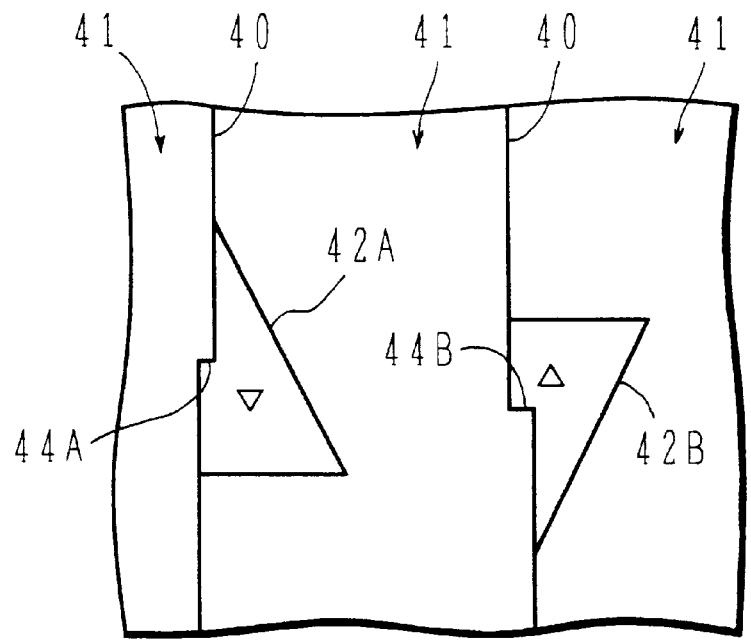
FIGS. 10A and 10B are schematic plan views of substrate surfaces illustrating the growth conditions of a CdTe layer formed on a GaAs layer on a support substrate having a diamond structure and the directions of etch pits on respective CdTe regions.
Figure 10B:
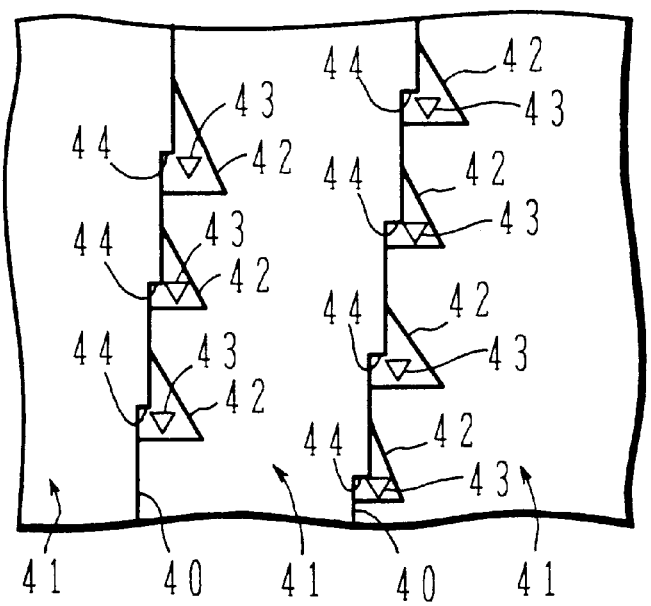

FIGS. 10A and 10B are schematic plan views showing a CdTe layer with the (111) B plane grown on a GaAs layer with the (100) plane formed on an Si substrate with the (100) plane. In the case of FIG. 10A, an Si off-substrate having the angle α=0° is used, and in the case of FIG. 10B, an Si off-substrate having the angle α=20° is used. In both FIGS. 10A and 10B, two steps 40 are formed in the vertical direction as viewed in FIGS. 10A and 10B, and a terrace 41 is formed between adjacent steps 40. It is assumed that the terrace 41 is high at the left area as viewed in FIGS. 10A and 10B, and low at the right area.

In the case of an Si off-substrate having the angle α=0°, although the step is straight in an ideal case, kinks having the directions different by 180° may appear in a real case similar to the case of FIG. 9B. As a GaAs layer is deposited on the Si substrate, As steps grow preferentially as described above and Ga kinks appear at the area corresponding to kinks on the Si surface.

Therefore, as shown in FIG. 10A, Ga kinks 44A and 44B having opposite directions are formed. The GaAs surface of FIG. 10A is equivalent to the GaAs surface of FIG. 9B. Therefore, a CdTe region 42A with an etch pit of a downward triangle and a CdTe region 42B with an etch pit of an upward triangle are formed.

In the case of an Si off-substrate having the angle α=20°, as shown in FIG. 10B, steps 40 and a number of kinks 44 are formed. All the kinks 44 have the same direction so that Ga kinks on the GaAs layer formed on this Si off-substrate have also the same direction. Since a number of Ga kinks with the same direction are formed on the GaAs surface shown in FIG. 10B, etch pits 43 formed in the CdTe regions 42 on the GaAs layer have also the same direction.

The above studies will possibly clarify why twin crystals are formed in the HgCdTe layer when an Si off-substrate with the angle α=0° is used and why twin crystals are not formed in the HgCdTe layer when an Si off-substrate with the angle α=20° is used. From these studies, it can be considered that twin crystals are not formed if Ga kinks on the GaAs layer are made to have the same direction. As a result, it can be expected that a good HgCdTe layer having no twin crystal is grown not only at the angle α=20° but also at the angle larger than 0° and smaller than 45°.

In the second embodiment, the angle θ is set to 2°. The angle θ is not limited to only 2° so long as steps are formed on an Si substrate. For example, the angle θ may be set to 0.5° to 20°. It is preferable to set the angle θ to 1° to 10° from the viewpoint of feasibility of forming a substrate.

As described with FIG. 9A, a good CdTe layer having no twin crystal can be formed on a GaAs surface with Ga steps. Therefore, a GaAs layer may be deposited under the condition that Ga steps are formed aLong steps having the maximum number on the Si off-substrate satisfying $0°≦α<45°$ and $0.5°≦θ≦20°$.

It is known that which of Ga steps and As steps are formed along steps having the maximum number on the surface of an Si substrate, depends on the surface condition of the Si substrate. It is preferable to select a proper deposition condition through experiments of depositing GaAs layers on various types of off-substrates.

In the second embodiment, a GaAs layer is deposited on an Si off-substrate. Single crystal substrate other than Si having a diamond structure may also be used. Other group III–V compound semiconductor layers may be used in place of a GaAs layer. For example, GaAs, InP, AlAs, GaP, and mixed crystals thereof may be used.

In the second embodiment, a CdTe layer is used as a buffer layer. Other group II–VI compound semiconductor layers may be used. For example, CdTe, CdS, CdSe, ZnTe, ZnSe, and mixed crystals thereof may be used. Because the buffer layer is used for relieving a lattice constant mismatch between two layers at the lower and higher levels than the buffer layer, it is preferable to use the material having a median value of lattice constants of the two layers.

Next, an infrared detector using a HgCdTe layer of the above embodiments will be described.

Figure 11:
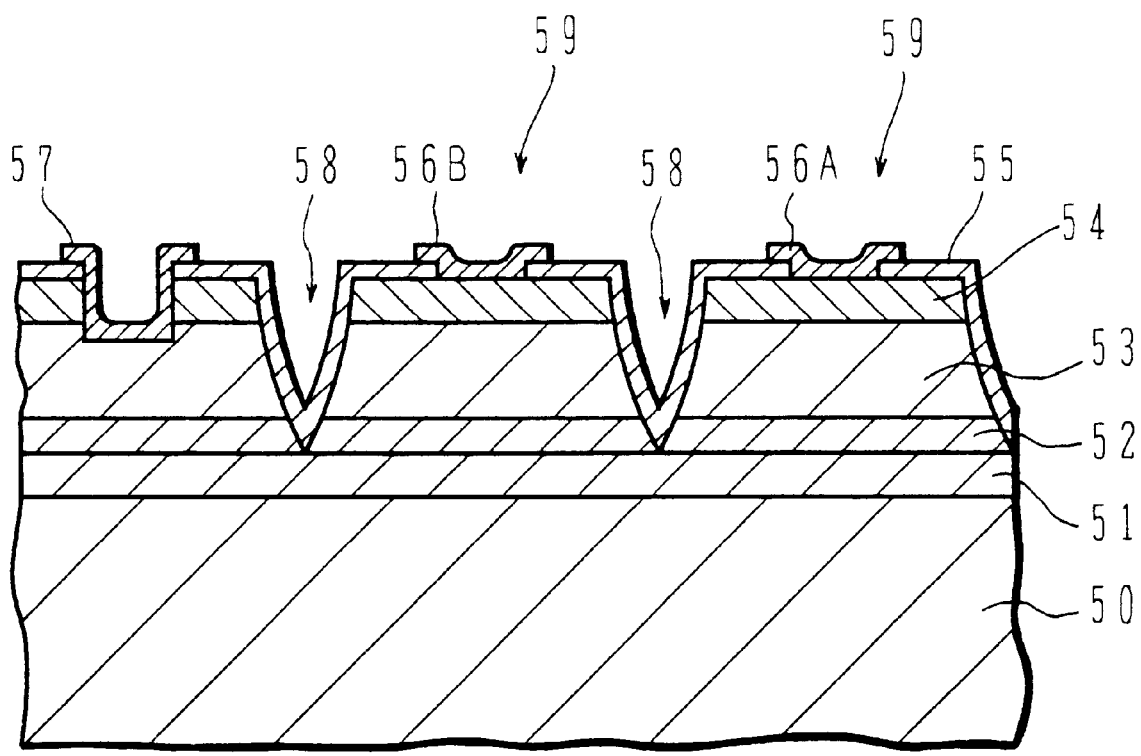
FIG. 11 is a cross sectional view of an infrared detector using a laminate structure of a semiconductor device according to an embodiment of the invention.

FIG. 11 is a cross sectional view of an infrared detector using a HgCdTe layer. Formed on an Si substrate 50 are an n-type GaAs layer 51, an n-type CdTe layer 52, an n-type HgCdTe layer 53, and a p-type HgCdTe layer 54.

The n-type GaAs layer 51 has a thickness of 0.5 to 2 μm, and is doped with Si to have an electron concentration of $1×10^{17}$ cm$^{-3}$ or higher. The n-type CdTe layer 52 has a thickness of 2 μm, and is doped with iodine to have an electron concentration of $1×10^{17}$ cm$^{-3}$ or higher.

The n-type HgCdTe layer 53 has a thickness of 0.5 to 10 μm, and is doped with iodine to have an electron concentration of 0.5 to $5×10^{15}$ cm$^{-3}$. Its compositions are $Hg_{0.785}Cd_{0.215}Te$. The p-type HgCdTe layer 54 has a thickness of 2 μm, and is doped with As to have a hole electron concentration of $1×10^{17}$ cm$^{-3}$ or higher. Its compositions are $Hg_{0.72}Cd_{0.28}Te$.

Separation trenches 58 are formed from the surface of the p-type HgCdTe layer 54 to the bottom of the n-type CdTe layer 52. The separation trenches 58 separate a plurality of diodes 59 of a mesa structure. A CdTe passivation film 55 is formed covering the surfaces of the mesa structures. The CdTe passivation film 55 is undoped and is substantially an insulation layer.

Through contact holes formed in the CdTe passivation film of each mesa structure, p-side electrodes 56A and 56B are connected to the p-type HgCdTe layer 54. At one particular mesa structure, through a contact hole formed in the CdTe passivation film 55 and p-type HgCdTe layer 54, an n-side electrode 57 is connected to the n-type HgCdTe layer 53. This n-type HgCdTe layer 53 is electrically connected via the n-type GaAs layer 51 to the n-type HgCdTe layers of other mesa structures.

In this manner, a plurality of diodes are formed by using the n-side electrode as a common electrode. When infrared rays are incident from the bottom of the Si substrate 50, pairs of electrons and holes are generated at the p-n junction of each diode 59. Potential differences corresponding to the intensity of incident infrared rays are generated between the common electrode 57 and p-side electrode 56A and between the common electrode 57 and p-side electrode 56B.

The separation trenches 58 formed from the surface of the p-type HgCdTe layer 54 to the bottom of the n-type CdTe layer 52 can prevent cracks from being formed by a difference of thermal expansion coefficient between HgCdTe and Si.

As described with the first embodiment, a good HgCdTe layer can be formed by inserting a HgTe layer (not shown) between the CdTe layers 52 and 53. As described with the second embodiment, by using the Si off-substrate satisfying $0°<α<45°$ and $0.5°≦θ≦20°$, a good HgCdTe layer with no twin crystal can be formed. By using this HgCdTe layer, an infrared detector of good characteristics can be formed.

The present invention has been described in connection with the preferred embodiments. The invention is not limited only to the above embodiments. It is apparent to those skilled in the art that various modifications, improvements, combinations and the like can be made without departing from the scope of the appended claims.

We claim:

1. A semiconductor device comprising:
   a support substrate comprising a semiconductor substrate and a layer formed on an upper surface of said semiconductor substrate, said semiconductor substrate comprising a silicon substrate and a GaAs layer formed on said silicon substrate, said silicon substrate having a surface tilted from the (100) plane by a certain angle, along a direction offset by an angle larger than 0° and smaller than 45° from the [011] direction in the (100) plane so that a plurality of steps and kinks are formed on the surface, said kinks being pointed to a same direction, and said layer having a surface with the (111) B plane and being selected from the group consisting of a CdTe layer, a ZnTe layer, and a CdZnTe layer;
   a HgTe layer formed on said support substrate; and
   a HgCdTe layer directly formed on said HgTe layer.

2. A semiconductor device according to claim 1, wherein said HgTe layer has a thickness of 0.3 μm or thinner.

3. A semiconductor device according to claim 1, wherein said certain angle is in the range from 0.5° to 20°.

4. An infrared detector comprising:

a support substrate having an upper surface, said support substrate comprising a semiconductor substrate and a layer formed on the tipper surface of said semiconductor substrate, an infrared ray being transmissive through said support substrate;

said semiconductor substrate comprising a silicon substrate and a GaAs layer formed on said silicon substrate, said silicon substrate having a surface tilted from the (100) plane by a certain angle, along a direction offset by an angle larger than 0° and smaller than 45° from the direction in the (100) plane so that a plurality of steps and kinks are formed on the surface, said kinks being pointed to a same direction, and said layer having a surface with the (111) B plane and being selected from the group consisting of a CdTe layer, a ZnTe layer, and a CdZnTe layer;

a HgTe layer formed on said support substrate;

a first HgCdTe layer of a first conductivity type directly formed on said HgTe layer; and a second HgCdTe layer of a second conductivity type opposite to the first conductivity type formed on said first HgCdTe layer.

5. A semiconductor device comprising:

a support substrate having an upper surface tilted from the (100) plane of a single crystal with a diamond structure by a certain angle, along a direction offset by an angle larger than 0° and smaller than 45° from the [011] direction in the (100) plane so that a plurality of steps and kinks are formed on the upper surface, said kinks being pointed to a same direction;

a group III–V compound semiconductor layer formed on said support substrate; and a group II–VI compound semiconductor layer having a surface with the (111) B plane and formed on said group III–V compound semiconductor layer.

6. A semiconductor device according to claim 5, wherein said group III–V compound semiconductor layer is made of a material selected from the group consisting of GaAs, InP, AlAs, GaP, and mixed crystals thereof.

7. A semiconductor device according to claim 5, wherein said group II–VI compound semiconductor layer is made of a material selected from the group consisting of CdTe, CdS, CdSe, ZnTe, ZnS, ZnSe, and mixed crystals thereof.

8. An infrared detector according to claim 4, wherein said HgTe layer has a thickness of 0.3 µm or thinner.

9. An infrared detector according to claim 4, wherein the upper surface of said support substrate is of a material selected from the group consisting of CdTe, ZnTe, and CdZnTe.

10. An infrared detector according to claim 9, wherein said support substrate comprises:

a semiconductor substrate having an upper surface; and a layer formed on said semiconductor substrate, said layer being selected from the group consisting of a CdTe layer, a ZnTe layer, and a CdZnTe layer.

11. An infrared detector comprising:

a support substrate having an upper surface, an infrared ray being transmissive through said support substrate;

said support substrate comprising a semiconductor substrate having an upper surface and a layer formed on upper surface of said semiconductor substrate, said layer being selected from the group consisting of a CdTe layer, a ZnTe layer, and a CdZnTe layer;

said semiconductor substrate comprising a silicon substrate and a GaAs layer formed on said silicon substrates;

a HgTe layer formed on said support substrate;

a first HgCdTe layer of a first conductivity type directly formed on said HgTe layer; and a second HgCdTe layer of a second conductivity type opposite to the first conductivity type formed on said first HgCdTe layer.

12. An infrared detector according to claim 11, wherein said silicon substrate has an exposed surface tilted from the (100) plane by a certain angle, along a direction offset by an angle larger than 0° and smaller than 45° C. from the [011] direction in the (100) plane.

13. An infrared detector according to claim 12, wherein said certain angle is in the range from 0.5° to 20°.

14. An infrared detector according to claim 4 wherein said first HgCdTe layer and said second HgCdTe layer have mesa structures disposed in an array.

* * * * *